(12) United States Patent
Okuda et al.

(10) Patent No.: US 7,763,541 B2
(45) Date of Patent: Jul. 27, 2010

(54) PROCESS FOR REGENERATING LAYER TRANSFERRED WAFER

(75) Inventors: Hidehiko Okuda, Tokyo (JP); Akihiko Endo, Tokyo (JP); Tatsumi Kusaba, Tokyo (JP)

(73) Assignee: Sumco Corporation, Tokyo (JP)

( * ) Notice: Subject to any disclaimer, the term of this patent is extended or adjusted under 35 U.S.C. 154(b) by 157 days.

(21) Appl. No.: 11/563,981

(22) Filed: Nov. 28, 2006

(65) Prior Publication Data

US 2008/0124929 A1 May 29, 2008

(30) Foreign Application Priority Data

Nov. 28, 2005 (JP) ............................. 2005-341397

(51) Int. Cl.
*H01L 21/302* (2006.01)
(52) U.S. Cl. .................. 438/692; 438/459; 438/795
(58) Field of Classification Search ............... 438/113, 438/795–799, 692, 455–459, 471, 479; 257/E21.324
See application file for complete search history.

(56) References Cited

U.S. PATENT DOCUMENTS

| | | | |
|---|---|---|---|
| 6,103,599 A * | 8/2000 | Henley et al. | 438/459 |
| 6,284,628 B1 * | 9/2001 | Kuwahara et al. | 438/459 |
| 2001/0029072 A1 | 10/2001 | Kuwahara et al. | |
| 2003/0054641 A1 | 3/2003 | Binns et al. | |
| 2003/0170990 A1 * | 9/2003 | Sakaguchi et al. | 438/690 |
| 2005/0245048 A1 | 11/2005 | Graf et al. | |
| 2006/0228846 A1 * | 10/2006 | Endo et al. | 438/197 |
| 2006/0281280 A1 * | 12/2006 | Endo et al. | 438/455 |
| 2007/0216042 A1 * | 9/2007 | Delprat et al. | 257/E21.324 |

FOREIGN PATENT DOCUMENTS

| | | |
|---|---|---|
| EP | 0 955 671 A1 | 11/1999 |
| EP | 1 087 041 A1 | 3/2001 |
| EP | 1 156 531 A1 | 11/2001 |
| JP | 2001 155978 A | 6/2001 |
| JP | A 2001-155978 | 6/2001 |

OTHER PUBLICATIONS

"European Search Report", mailed Apr. 29, 2008, for EP 06023455. 6-1528, 3pgs.
English language machine translation of JP 2001-155978 A.

* cited by examiner

*Primary Examiner*—Savitri Mulpuri
(74) *Attorney, Agent, or Firm*—Greenblum & Bernstein, P.L.C.

(57) ABSTRACT

There is provided a layer transferred wafer subjected to a process for regenerating to be reused many times for an SOI layer wafer which is used to manufacture an SOI wafer with an excellent process yield in which oxygen precipitate nuclei or oxygen precipitates are eliminated and generation of HF defects are inhibited by performing the process for regenerating the layer transferred wafer generated as a by-product by an ion implantation separation method.

The process for regenerating a layer transferred wafer in which the layer transferred wafer 11*b* obtained as a by-product in manufacturing a bonded SOI wafer 10 by an ion implantation separation method so as to be reused for an SOI layer wafer 11 of the bonded SOI wafer 10, comprises: rapidly heating the layer transferred wafer 11*b* in an oxidizing atmosphere, then holding it for a fixed time and subsequently rapidly cooling it; and mirror-polishing a surface of the layer transferred wafer 11*b*.

15 Claims, 5 Drawing Sheets

(a)

(b)

HF cleaning (c)

PROCESS FOR REGENERATING LAYER TRANSFERRED WAFER

BACKGROUND OF THE INVENTION

1. Field of the Invention

The present invention relates to a regenerating process to reuse for an SOI layer wafer a layer transferred wafer obtained as a by-product in a so-called ion implantation separation method (which is also referred to as a smart-cut method) wherein an ion implanted wafer is separated after bonding to manufacture SOI (silicon on insulator). In particular, the present invention relates to a process for regenerating a layer transferred wafer many times.

2. Description of Related Art

As a manufacturing process of an SOI wafer, generally, there has been conventionally known an ion implantation separation method wherein an SOI layer wafer consisting of single-crystal silicon having a hydrogen ion or a rare gas ion implanted therein is bonded to a support wafer through an oxide film and separated in an ion implanted region by a heat treatment in order to manufacture an SOI wafer. A cleaved surface of the SOI wafer obtained by this process is an excellent mirror surface, and hence the SOI wafer can be obtained of which film thickness has high uniformity.

Further, as a process for obtaining as a by-product a layer transferred wafer in a lower portion of the SOI layer wafer which has not been used for an SOI layer of the SOI wafer and reusing this layer transferred wafer for an SOI layer wafer in order to remanufacture an SOI wafer, there are disclosed a process for regenerating a layer transferred wafer and a layer transferred wafer (see, e.g., Patent Reference 1).

In this process for regenerating a layer transferred wafer, when an ion implanted area at least in a chamfered portion of a layer transferred wafer is removed, and then a surface of the layer transferred wafer is polished to be reused for an SOI layer wafer, the ion implanted area does not remain in the chamfered portion even if a heat treatment is performed. Therefore, the chamfered portion is not separated and no particle is produced, and hence no particles adhere to a device region of an SOI wafer. Further, the SOI wafer manufactured by reusing the layer transferred wafer for an SOI layer wafer has a high quality and an excellent yield ratio.

[Patent Reference 1] Japanese Unexamined Patent Application No. 2001-155978 (claim 2, claim 4, paragraphs [0012], [0015] and [0017], FIG. 4)

However, the above-mentioned conventional process for regenerating a layer transferred wafer is characterized in that a layer transferred wafer is subjected to a heat treatment and then a surface of the layer transferred wafer is polished (See Patent Reference 1 [claim 4]). The heat treatment conditions before polishing thereabove, the layer transferred wafer is held in an oxidizing atmosphere at a temperature of 500° C. or higher for several minutes to several hours. Alternatively, the layer transferred wafer is held at 1000° C. for 30 minutes in Second Embodiment thereabove. Here, in the heat treatment of holding at the heat treatment temperature of 1000° C. for 30 minutes, generation of oxygen precipitates or oxygen precipitate nuclei in the layer transferred wafer is facilitated. Therefore, when the regenerated layer transferred wafer is reused for an SOI layer wafer in order to manufacture a bonded SOI wafer, oxygen precipitate nuclei or oxygen precipitates exist in an SOI layer.

In the SOI wafer having oxygen precipitates or oxygen precipitate nuclei in an SOI layer 111a as shown in FIG. 5(a), depending on the size of an oxygen precipitate nucleus or an oxygen precipitate 117, points where they exist become piercing defects 120 which pierces the SOI layer 111a as shown in FIG. 5(b). Therefore, when a non-illustrated natural oxide film on the surface of the bonded SOI wafer is cleaned by using a fluorinated acid (hydrofluoric acid) aqueous solution, the hydrofluoric acid aqueous solution etches an buried oxide film 113 between the SOI layer 111a and a support wafer 112 of the bonded wafer through each piercing defects 120 formed in the SOI layer 111a. As a result, as shown in FIG. 5(c), there is a problem that each HF defect 121 is generated.

SUMMARY OF THE INVENTION

It is an object of the present invention to provide a process for regenerating a layer transferred wafer capable of inhibiting generation of an HF defect, and a layer transferred wafer regenerated by this process.

The present invention of claim 1, as shown in FIG. 1, relates to a regenerating process to reuse a layer transferred wafer 11b for an SOI layer wafer, wherein the layer transferred wafer 11b is obtained as a by-product in manufacturing a bonded SOI wafer by an ion implantation separation method, comprising: rapidly heating the layer transferred wafer 11b in an oxidizing atmosphere, then holding it for a fixed time and rapidly cooling it; and mirror-polishing a surface of the layer transferred wafer 11b.

The present inventors have found that oxygen solid solubility of the layer transferred wafer 11b can be increased to dissolve oxygen precipitate nuclei or oxygen precipitates by subjecting to rapid heating under the predetermined conditions the layer transferred wafer 11b obtained as a by-product in manufacturing the bonded SOI wafer by the ion implantation separation method, and rapid cooling under the predetermined conditions enables the layer transferred wafer 11b to be held in a solid solution state, so that re-precipitation of oxygen precipitate nuclei or oxygen precipitates can be prevented.

In the process for regenerating a layer transferred wafer described in claim 1, since the layer transferred wafer 11b is rapidly heated in the oxidizing atmosphere, the oxygen solid solubility of the layer transferred wafer 11b is increased, and oxygen atoms constituting the oxygen precipitate nucleus or the oxygen precipitate can be dispersed in lattices of silicon atoms, so that interstitial oxygen can be obtained. Moreover, since this layer transferred wafer 11b is rapidly cooled, the solid solution state can be maintained, whereby oxygen precipitate nuclei or oxygen precipitates generated in the layer transferred wafer 11b can be eliminated.

Moreover, since many interstitial silicon atoms exist immediately below an oxide film 13 formed on the surface of the layer transferred wafer 11b by a rapid heating/rapid cooling process (RTP: rapid thermal process), it is possible to inhibit the growth of the oxygen precipitate in the SOI wafer manufactured by using the SOI layer wafer 11 subjected to this regenerating process.

According to the present invention defined in claim 6, as shown in FIG. 2, there is provided a process for regenerating a layer transferred wafer, obtained as a by-product in manufacturing a bonded SOI wafer 10 by an ion implantation separation method, comprising: mirror-polishing a surface of the layer transferred wafer 11b; rapidly heating the layer transferred wafer 11b in an oxidizing atmosphere, then holding it for a fixed time and subsequently rapidly cooling it; and removing an oxide film on the surface of the layer transferred wafer 11b.

In the process for regenerating a layer transferred wafer according to claim 6, since the layer transferred wafer 11b is rapidly heated in the oxidizing atmosphere, oxygen solid solubility of the layer transferred wafer 11b is increased, and oxygen atoms constituting an oxygen precipitate nucleus or an oxygen precipitate can be diffused between lattices of silicon atoms, so that interstitial oxygen can be obtained.

Since this layer transferred wafer 11b is rapidly cooled, the solid solution state can be maintained, whereby oxygen precipitate nuclei or oxygen precipitates generated in the layer transferred wafer 11b can be eliminated. Further, since many interstitial silicon atoms exist immediately below an oxide film 13 formed on the surface of the layer transferred wafer 11b by a rapid heating/rapid cooling process (RTP: rapid thermal process) after mirror-polishing, it is possible to inhibit the growth of the oxygen precipitate in an SOI wafer manufactured by reusing the SOI layer wafer 11 subjected to regeneration. Furthermore, the oxide film formed on the surface of the layer transferred wafer can be removed.

According to the present invention defined in claim 2, there is provided a process for regenerating a layer transferred wafer according to the present invention set forth in claim 1, wherein the rapid heating/rapid cooling is applied to the layer transferred wafer 11b from a room temperature to a temperature in the range of 1000 to 1350° C. at the temperature elevating speed of 50 to 5000° C./minute, then holds the same at this temperature for 1 to 1000 seconds, subsequently cools the same from this temperature to a room temperature at a temperature lowering speed of 50 to 5000° C./minute.

According to the present invention defined in claim 7, there is provided a process for regenerating a layer transferred wafer according to the present invention defined in claim 6, wherein the rapid heating/rapid cooling process is applied to the layer transferred wafer 11b from a room temperature to a temperature in the range of 1000 to 1350° C. at a temperature elevating speed of 50 to 5000° C./minute, then holds the same at this temperature for 1 to 1000 seconds, and subsequently cools the same from this temperature to a room temperature at a temperature lowering speed of 50 to 5000° C./minutes.

In the process for regenerating a layer transferred wafer described in claim 2 and claim 7, the heat treatment at a high temperature from 1000° C. to a temperature less than the fusing point of silicon does not grow and can eliminate oxygen precipitate nuclei or oxygen precipitates in the layer transferred wafer 11b.

According to the present invention defined in claim 3, there is provided a process for regenerating a layer transferred wafer according to the present invention set forth in claim 1, wherein the oxidizing atmosphere is an oxygen gas, a nitrogen gas containing oxygen or an argon gas containing oxygen.

According to the present invention defined in claim 8, there is provided a process for regenerating a layer transferred wafer according to the present invention set forth in claim 6, wherein the oxidizing atmosphere is an oxygen gas, a nitrogen gas containing oxygen or an argon gas containing oxygen.

In the process for regenerating a layer transferred wafer described in claim 3 and claim 8, since a heat treatment is not carried out in a reducing atmosphere such as hydrogen, a compound is not generated in a furnace and does not adhere to a surface of the layer transferred wafer 11b, the compound cannot be a cause of a damage in a subsequent mirror polishing and a cause of a void at the time of bonding when the layer transferred wafer is reused for an SOI layer wafer 11.

According to the present invention defined in claim 4, there is provided a process for regenerating a layer transferred wafer according to the present invention defined in claim 1, wherein a removal amount in the mirror polishing is 1 to 5 µm.

According to the present invention defined in claim 9, there is provided a process for regenerating a layer transferred wafer according to the present invention defined in claim 6, wherein a removal amount in the mirror polishing is 1 to 5 µm.

In the process for regenerating a layer transferred wafer described in claim 4 and claim 9, wherein roughness on a separated surface 18 of the layer transferred wafer 11b are smoothened, and a central part and a peripheral part of the surface of the layer transferred wafer 11b can be removed, so that flatness can be obtained.

According to the present invention defined in claim 5, there is provided a process for regenerating a layer transferred wafer according to the present invention defined in claim 1, wherein the oxide film 13 on the chamfered portion and an ion implanted area 14 in the chamfered portion of the layer transferred wafer 11b are removed by edge polishing after the heating/cooling and before mirror-polishing.

According to the present invention defined in claim 10, there is provided a process for regenerating a layer transferred wafer according to the present invention set forth in claim 6, wherein the oxide film 13 on the chamfered portion of the layer transferred wafer 11b and the ion implanted area 14 in the chamfered portion of the same are removed by edge polishing before mirror-polishing.

In the process for regenerating a layer transferred wafer described in claim 5 and claim 10, a removal amount in mirror polishing can be reduced, and the surface of the layer transferred wafer 11b can be further improved in flatness.

According to the present invention defined in claim 11, there is provided a process for regenerating a layer transferred wafer of the present invention set forth in claim 6, wherein the oxide film 11a is removed by using an aqueous solution containing fluorinated acid.

In the process for regenerating a layer transferred wafer described in claim 11, the oxide film 11a formed on the surface of the layer transferred wafer 11b by the rapid heating/rapid cooling can be removed by using fluorinated acid.

According to the present invention defined in claim 12, there is provided a layer transferred wafer regenerated by the process described in any one of claims 1 to 11 as shown in FIG. 1 or 2.

In the regenerated layer transferred wafer described in claim 12, an oxygen precipitate or a precipitate nucleus is eliminated. Therefore, when this layer transferred wafer 11b is reused for an SOI layer wafer to manufacture a bonded SOI wafer 10, a piercing defect caused due to the oxygen precipitates or the oxygen precipitate nuclei is not generated, and generation of an HF defect is inhibited in cleaning using a fluorinated acid solution and removing a natural oxide film on the surface of the bonded SOI wafer 10.

As described above, according to the present invention, the layer transferred wafer generated as a by-product by the ion implantation separation method is subjected to rapid heating/rapid cooling. Then, the oxygen solid solubility of the layer transferred wafer is increased by rapid heating, oxygen atoms are diffused between lattices of silicon atoms to dissolve oxygen precipitate nuclei or oxygen precipitates, and the solid solution state is maintained by rapid cooling, so that oxygen precipitate nuclei or oxygen precipitates are eliminated. As a result, it is possible to manufacture a high-quality SOI wafer in which each HF defect is inhibited even if it is reused for an SOI layer wafer again and again.

DETAILED DESCRIPTION OF THE PREFERRED EMBODIMENTS

The best embodiment for carrying out the present invention will now be described with reference to the accompanying drawings.

First Embodiment

Figure 1:
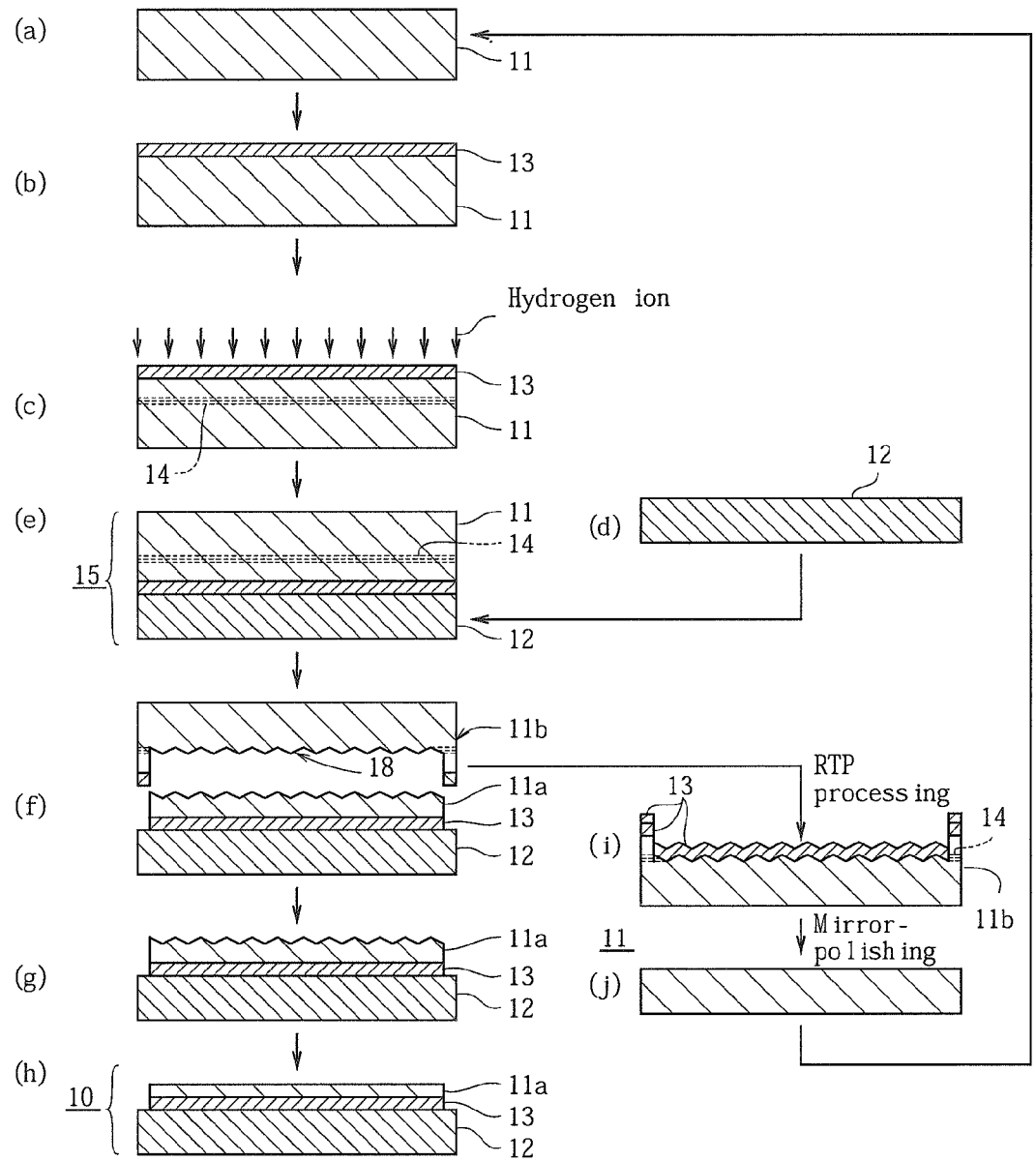
FIG. 1 is a view showing a process for regenerating a layer transferred wafer according to the first example of the present invention in a process flow.

According to a process for regenerating a layer transferred wafer of the present invention, as shown in FIG. 1(h), a layer transferred wafer 11b generated as a by-product in a process of manufacturing an SOI wafer 10 by a ion implantation separation method is determined as a target. As shown in FIG. 1, the ion implantation separation method comprises: forming an oxide film 13 on a surface of an SOI layer wafer 11 serving as an SOI layer 11a(FIG. 1(b)); forming an ion implanted area 14 in the SOI layer wafer 11 by implanting an ion into this SOI layer wafer 11(FIG. 1(c)); forming a laminated body 15 by bonding the SOI layer wafer 11 to a support wafer 12 serving as a support substrate (FIG. 1(e)); separating the SOI layer wafer 11 from the ion implanted area 14 to form the SOI layer 11a consisting of a single-crystal thin film on the support wafer 12 through the oxide film 13(FIG. 1(f)); heat-treating the support wafer 12 with the SOI layer 11a to increase the bonding strength(FIG. 1(g)); and mirror-polishing the surface of the SOI layer 11a to remove a defective layer and surface roughness therefrom (FIG. 1(h)). Further, the process for regenerating a layer transferred wafer according to the present invention comprises: rapidly heating/rapidly cooling the layer transferred wafer 11b separated from the ion implanted area 14 by a separation heat treatment shown in FIG. 1(f) (FIG. 1(i)); and mirror-polishing the layer transferred wafer 11b (FIG. 1(j)), and the process leads back to an oxide film formation (FIG. 1(a)) of forming the oxide film 13 on the surface of the SOI layer wafer 11 and is performed repeatedly.

A description will be given as to the thus configured process for regenerating a layer transferred wafer (FIGS. 1(i) and (j)).

1 Rapid Heating/Rapid Cooling

The SOI layer wafer 11 and the support wafer 12 are manufactured by a Czochralski process (CZ process) (FIGS. 1(a) and (d)). The SOI wafer 10 and the layer transferred wafer 11b consist of silicon single crystal. They are manufactured by separating the laminated body 15 in which the SOI layer wafer 11 and the support wafer 12 are superimposed, from the ion implanted area 14 by the separation heat treatment.

When the SOI layer wafer 11 is subjected to thermal oxidation at a high temperature of 900° C. or higher, the oxide film 13 (an $SiO_2$ film) with a thickness of 50 to 300 nm serving as an insulating film is formed on the entire surface of the SOI layer wafer 11 (FIG. 1(b)).

Further, a hydrogen ion ($H^+$) is ion-implanted from one of main surfaces of the SOI layer wafer 11 in a dose amount of $5.0 \times 10^{16}$ or more, and the ion implanted area 14 having a thickness of 200 to 1200 nm is formed in the SOI layer wafer 11 in parallel with the oxide film 13 (FIG. 1(c)).

Therefore, there is generated difference in total thicknesses of the SOI layer 11a and the ion implanted area 14 forming a part of the oxide film 13 and the SOI wafer 10 between at a central part and at a periphery of a separated surface 18 of the layer transferred wafer 11b obtained as a by-product after the separation heat treatment (FIG. 1(f)) in the ion implantation separation method.

Furthermore, the SOI layer wafer consists of a CZ silicon single crystal. A concentration of impurity oxygen usually contained in the CZ silicon single crystal has the solid solubility in the vicinity of a silicon fusing point of 1414° C. (under one atmosphere of pressure), and contains impurity oxygen constantly oversaturated at a room temperature and at a device manufacturing process temperature. Therefore, oxygen is always apt to precipitate in a device manufacturing heat treatment. Moreover, a dislocation or a stacking fault as an agglomerate of interstitial silicon atoms existing in the silicon single crystal becomes oxygen precipitate nucleus. Since oversaturated oxygen and oxygen precipitate nuclei exist in the SOI layer wafer 11, heat treatments on multiple stages, i.e., the heat treatment (FIG. 1(b)) for formation of the oxide film and the separation heat treatment (FIG. 1(f)) are carried out for 5 hours at an intermediate temperature in the vicinity of 1000° C. and for 30 minutes at a low temperature in the vicinity of 500° C. As a result, the oxygen nuclei grow, and the grown oxygen precipitate nuclei or oxygen precipitates exist in the layer transferred wafer 11b immediately after separation.

As shown in FIG. 1(i), in the rapid heating/rapid cooling, the layer transferred wafer 11b is rapidly heated in an oxidizing atmosphere, and held for a fixed time at a high temperature. Then, the oxygen solid solubility in the layer transferred wafer 11b is increased, whereby oxygen atoms constituting the oxygen precipitate nuclei or the oxygen precipitates are diffused in lattices of silicon atoms, so that interstitial oxygen atoms are obtained. This state is referred to as a solid solution state that the oxygen precipitate nuclei or the oxygen precipitates are dissolved. When the layer transferred wafer 11b in this solid solution state is gradually cooled at a room temperature lowering speed, the interstitial oxygen atoms move away from the lattices of the silicon atoms and precipitate again as oxygen precipitate nuclei or oxygen precipitate again. However, when the layer transferred wafer 11b is rapidly cooled in a short time, the solid solution state is maintained, and the oxygen precipitate nuclei or the oxygen precipitates do not precipitate again. Therefore, the oxygen precipitate nuclei or the oxygen precipitates can be eliminated.

It is to be noted that either elimination or growth of the oxygen precipitates in the layer transferred wafer 11b greatly depends on conditions of the size of each oxygen precipitate and a heat treatment temperature. The smaller the size of the oxygen precipitate is, the more readily the oxygen precipitate is eliminated by an energy at an interface between each oxygen precipitate and each silicon atom. The higher the heat treatment temperature is, the more the oxygen solid solubility in the silicon crystal is increased and thereby the more readily each oxygen precipitate is dissolved.

A size of each oxygen precipitate in the layer transferred wafer 11b is determined by an oxygen concentration of the silicon single crystal to be used, each vacancy having a lattice defect density determined by a cooling speed when pulling up the silicon single crystal, interstital silicon, oxidation conditions for forming an buried oxide film or conditions for the separation heat treatment. Moreover, since a heat treatment for formation of an oxide film on a general silicon wafer is carried out in the vicinity of 1000° C. and the separation heat treatment is in the vicinity of 500 to 600° C., a size of each oxygen precipitate generated under such heat treatment conditions can be presumed to be 100 nm or smaller. In order to eliminate each oxygen precipitate having a size of 100 nm or smaller without growing oxygen precipitate by the rapid heating/rapid cooling during elevating temperature, a heat treatment must be carried out under conditions of a temperature elevating speed of 50° C./minute or higher, a heat treatment temperature of 1000° C. or higher and a holding time of one second or more.

At this rapid heating/rapid cooling, the layer transferred wafer 11b is accomodated in a rapid thermal annealing furnace, heated to from a room temperature to a temperature in the range of 1000 to 1350° C. at a temperature elevating speed of 50 to 5000° C./minute, then held for 1 to 1000 seconds, and subsequently cooled from the temperature to a room temperature at a temperature lowering speed of 50 to 5000° C./minute.

It is to be noted that an atmosphere in the furnace during the heat treatment is an oxidizing atmosphere. Preferably, the atmosphere in the furnace is an oxidizing atmosphere of, e.g., an oxygen gas, a nitrogen-mixed gas containing oxygen or an argon-mixed gas containing oxygen. Here, the atmosphere in the furnace is restricted to the oxydizing atmosphere because a product of silicon and argon or the like is generated in the furnace during the heat treatment of the layer transferred wafer 11b in a reducing atmosphere of a 100% argon gas or the like, and a possibility that the product adheres to the surface of the layer transferred wafer 11b is high. Further, there occurs a problem that this product results in a damage in a subsequent mirror polishing or it becomes a cause of a void defect in the step of bonding when the layer transferred wafer 11b is reused for the SOI layer wafer 11. Furthermore, in the 100% nitrogen gas atmosphere, there occurs an inconvenience that a nitride film formed on the surface of the layer transferred wafer 11b by the heat treatment is hard to be removed at the subsequent mirror polishing and each vacancy generated in the layer transferred wafer 11b with nitrizing facilitates oxygen precipitation by a heat treatment in the step of bonding when the layer transferred wafer 11b is reused for the SOI layer wafer 11.

It is preferable for the temperature elevating speed and the temperature lowering speed to be as high as possible, and an increase or a reduction in temperature is carried out at a speed in the range of 50 to 5000° C./minute, or preferably 3000 to 5000° C./minute. Here, the temperature elevating speed is restricted to the range of 50 to 5000° C./minute because the oxygen solid solubility of the layer transferred wafer 11b cannot be increased in order to dissolve each oxygen precipitate nucleus or oxygen precipitate when the speed is less than 50°/minute, but the oxygen precipitate nucleus or oxygen precipitate is grown Additionally, the temperature lowering speed is restricted to the range of 50 to 5000° C./minute because the solid solubility state in which each oxynge precipitate nucleus or oxygen precipitate is elimianted cannot be maintained when the speed is less than 50° C./minute, and there is a problem that interstitial oxygen precipitates again as each oxygen precipitate nucleus or oxygen precipitate. Furthermore, when the temperature elevating speed and the temperature lowering speed both exceed 5000° C./minute, there occurs an inconvenience that the layer transferred wafer 11b is warped or cracked.

The heat treatment is carried out at a temperature in the range of 1000 to 1350° C., or preferably 1050 to 1200° C. Here, the temperature is restricted to the range of 1000 to 1350° C. because each oxygen precipitate is hard to be eliminated when the temperature is less than 1000° C. Further, when the temperature exceeds 1350° C., it is a fusing point of silicon or more, and hence silicon changes from a solid into a liquid form. Furthermore, an upper limit in the preferable range is set to 1200° C. because an incidence rate of slip is increased when the temperature exceeds 1200° C.

The heat treatment time is 1 to 1000 seconds, or preferably 1 to 100 seconds. Here, the heat treatment time is restricted to the range of 1 to 1000 seconds because of a limitation produced from the structure of the apparatus.

2 Mirror Polishing

As shown in FIG. 1(j), mirror-polishing the surface of the layer transferred wafer 11b by a chemical mechanical polishing process can remove the step of the separated surface 18 and the periphery of the layer transferred wafer 11b, a damaged layer of the separated surface 18 and the surface roughness.

Moreover, since the oxide film 13 is formed on the surface of the layer transferred wafer 11b by the rapid heating/rapid cooling process, the oxide film 13 can be also removed by this mirror polishing process.

A removal amount in the polishing is 1 to 5 µm, or preferably 3 to 4 µm. The removal amount is restricted to 1 to 5 µm because roughness on the separated surface 18 is hard to be smoothened when the removal amount is less than 1 µm and the step formed at the periphery cannot be completely removed. Additionally, when the removal amount exceeds 5 µm, there occurs an inconvenience that the flatness of the layer transferred wafer 11b is deteriorated.

Further, when only the step of the periphery of the layer transferred wafer 11b is edge-polished before mirror-polishing the entire surface of the layer transferred wafer 11b, the removal amount in the mirror polishing can be reduced, and the flatness of the surface of the layer transferred wafer 11b can be further improved.

Second Embodiment

Figure 2:
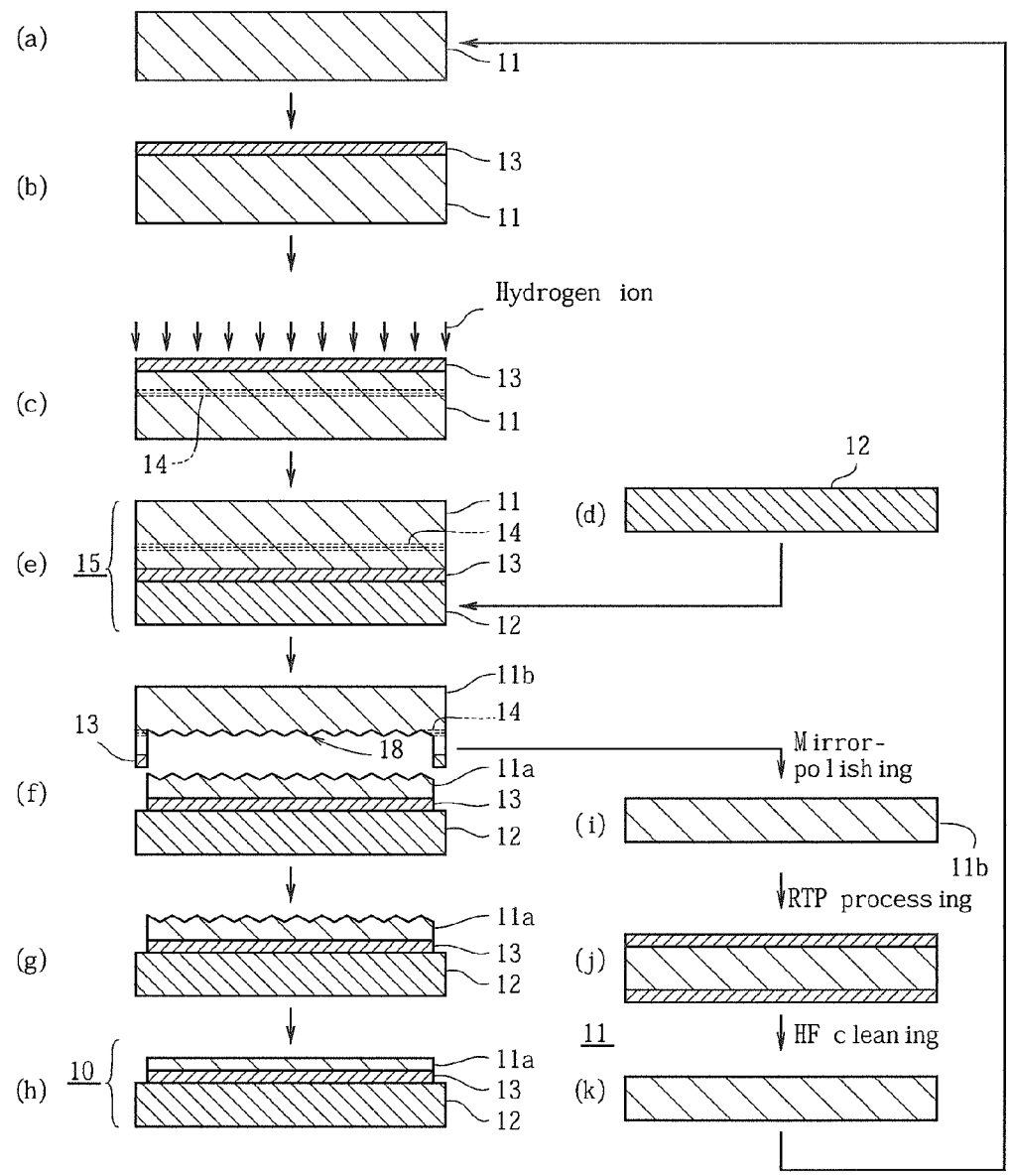
FIG. 2 is a view showing a process for regenerating a layer transferred wafer according to the second example of the present invention in a process flow.

FIG. 2 shows the second embodiment according to the present invention. Reference numerals in FIG. 2 denote the same components as those in FIG. 1.

According to this embodiment, in an order opposite to the process order of the first embodiment, a process for regeneration comprises: mirror-polishing a layer transferred wafer 11b separated from an ion implanted area 14 by a separation heat treatment shown in FIG. 2(f) (FIG. 2(i)); rapidly heating/rapidly cooling the layer transferred wafer 11b (FIG. 2(j)) and removing an oxide film 11a on a surface of the layer transferred wafer 11b (FIG. 2(k)), and this process leads back to an oxide film formation of forming an oxide film 13 on a surface of an SOI layer 11a wafer 11 (FIG. 2(a)) and is performed repeatedly. A description will now be given as to the thus configured process for regenerating a layer transferred wafer (FIGS. 2(*i*), (*j*) and (*k*))

1 Mirror Polishing

As shown in FIG. 2(*i*), a surface of the layer transferred wafer 11*b* is mirror-polished by a chemical mechanical polishing process. The chemical mechanical polishing process means rubbing the layer transferred wafer 11*b* with an abrasive cloth on a surface plate while running an abrasive to perform polishing. Roughness on the surface of the layer transferred wafer 11*b* can be eliminated and flattened by a combination of a chemical reaction brought by a solvent in the abrasive and a mechanical polishing function of the abrasive cloth and abrasive particles in the abrasive. As a result, it is possible to remove the step of a separated surface 18 and a periphery of the layer transferred wafer 11*b*, a damaged layer of the separated surface 18 and the surface roughness.

2 Rapid Heating/Rapid Cooling

In this rapid heating/rapid cooling, the layer transferred wafer 11*b* is accommodated in a rapid thermal annealing furnace, heated from a room temperature to a temperature in the range of 1000 to 1350° C. at a temperature elevating speed of 50 to 5000° C./minutes, then held for 1 to 1000 seconds, and subsequently cooled from the temperature to the room temperature at a temperature lowering speed of 50 to 5000° C./minute.

Since the above-described operation is substantially the same as that of the first embodiment, the explanation will not be given to avoid a repetition.

3 Oxide Film Removing

When the rapid heating/rapid cooling is performed after polishing the mirror as described above, an oxide film 13 with a thickness of 5 to 25 nm consisting of $SiO_2$ is formed on the surface of the layer transferred wafer 11*b*. Therefore, in the first embodiment, since the oxide film 13 formed on the surface of the layer transferred wafer 11*b* is also removed by mirror-polishing which is intended to remove the surface roughness or the like of the separated surface 18 of the layer transferred wafer 11*b* after the rapid heating/rapid cooling, another removal of the oxide film 13 is not required. In this second embodiment, the oxide film 13 formed on the surface of the layer transferred wafer 11*b* must be removed.

The oxide film is removed by using fluorinated acid, nitric acid or the like. More preferably, the layer transferred wafer 11*b* is dipped in a hydrofluoric acid aqueous solution to clean.

The layer transferred wafer 11*b* is dipped in the fluorinated acid (hydrofluoric acid) aqueous solution having an acid concentration of 0.5 to 10%, or preferably 0.5 to 5% for 5 to 30 minutes, or preferably 5 to 10 minutes to clean. The fluorinated acid concentration is restricted to the range of 0.5 to 10% because there occurs an inconvenience that it takes time to remove the oxide film when this concentration is less than 0.5% and the wafer surface becomes rough when this concentration exceeds 10%. Further, the processing time is restricted to the range of 5 to 30 minutes because there arises a problem that the oxide film cannot be completely removed when the processing time is less than 5 minutes and the wafer surface becomes rough when the processing time exceeds 30 minutes.

It is to be noted that the fluorinated acid cleaning is required as compared with the first embodiment, but the oxide film 13 is formed on the layer transferred wafer 11*b* by the rapid heating/rapid cooling and many solid solution interstitial silicon atoms exist immediately below this oxide film 13. Although a dislocation or a stacking fault as an agglomerate of such atoms becomes an oxygen precipitate nucleus, the solid solution interstitial silicon atoms do not become oxygen precipitate nuclei but inhibit oxygen precipitation. Therefore, the oxygen precipitation in the SOI layer wafer 11 subjected to regeneration according to the second embodiment are further inhibited as compared with that according to the first embodiment.

Further, although silicon is adopted as a semiconductor in the first and second embodiments, the present invention can be likewise applied to a semiconductor such as SiGe, SiC, Ge or the like.

EXAMPLES

Examples according to the present invention will now be described in detail together with comparative examples based on the first embodiment.

Reference Wafer

As shown in FIG. 1, there were first prepared an SOI layer wafer and a support wafer, each of which was a crystal having a diameter of 300 mm, an electrical resistivity of 1 to 10 Ωcm, an interstitial oxygen concentration of 12 to $14 \times 10^{17}$ atoms/$cm^3$ (old ASTM) and no COP's (crystal originated particles or pits) defect, and consisted of a P-type silicon wafer. Then, the SOI layer wafer was subjected to a heat treatment and held in a dried oxygen atmosphere at 1000° C. for 5 hours, so that an oxygen film having a thickness of 0.15 μm wafer was formed on an entire surface of the SOI layer wafer. Subsequently, the first main surface of the SOI layer wafer was ion-implanted in a hydrogen ion ($H^+$) dose amount of $6 \times 10^{16}/cm^2$ with an implantation energy of an accelerating voltage of 80 keV, thereby to form an ion implanted area in the SOI layer wafer. Then, after the SOI layer wafer and the support wafer were cleaned, the SOI layer wafer was superimposed on the support wafer in such a manner that the oxide film on the first main surface side of the SOI layer wafer adhered to the support wafer, thereby to form a laminated body.

This laminated body was accommodated in a heat treatment furnace, a temperature in this furnace was increased to 500° C. in a nitrogen ($N_2$) gas atmosphere, and the laminated body was held for 30 minutes, thereby to separate the laminated body from the ion implanted area. As a result, there was an SOI wafer consisting of the support wafer in which the SOI layer was superimposed via the oxide film.

Moreover, this SOI wafer was thin-filmed to a thickness of approximately 100 nm by using chemical mechanical polishing (CMP).

This thin-filmed SOI wafer was accommodated in the heat treatment furnace, a temperature in this furnace was increased to 1100° C. in a mixed gas atmosphere containing 95% of a nitrogen ($N_2$) gas and 5% of an oxygen ($O_2$) gas, and was held for 2 hours, so that the bond between the oxide film and the support wafer was strengthened. This SOI wafer was determined as a reference wafer.

Example 1-1

A layer transferred wafer generated as a by-product through separation from an ion implanted area in manufacturing a reference wafer was accommodated in a heat treatment furnace, heated from a room temperature to 1000° C. at a temperature elevating speed of 1000° C./minute, then held for 10 seconds, and subsequently subjected to rapid heating/rapid cooling, in which the wafer was cooled to the room temperature at a temperature lowering speed of 1000° C./minute. A surface of the layer transferred wafer was mirror-polished with a removal amount of 3 μm, and this wafer was reused for an SOI layer wafer. An SOI wafer was manufactured under the same conditions and procedure as those in the reference wafer by using this SOI layer wafer in which the layer transferred wafer was regenerated once. This SOI wafer was determined as a Example 1-1.

Example 1-2

A layer transferred wafer generated likewise according to Example 1-1 was accommodated in the heat treatment furnace with the same procedure as that in Example 1-1, heated from a room temperature to 1000° C. at a temperature elevating speed of 1000° C./minute, then held for 10 seconds, and subsequently subjected to rapid heating/rapid cooling, in which this wafer was cooled to the room temperature at a temperature lowering speed of 1000° C./minute. Thereafter, a surface of the layer transferred wafer was mirror-polished with a removal amount of 3 μm, and this wafer was reused for an SOI layer wafer. An SOI wafer was manufactured under the same conditions and procedure as those in the reference wafer by using the SOI layer wafer in which the layer transferred wafer was regenerated twice.

Example 1-3

A layer transferred wafer generated likewise according to Example 1-2 was accommodated in the heat treatment furnace with the same procedure as that of Example 1-1, heated from a room temperature to 1000° C. at a temperature elevating speed of 1000° C./minute, then held for 10 seconds, and subsequently subjected to rapid heating/rapid cooling, in which this wafer was cooled to the room temperature at a temperature lowering speed of 1000° C./minute. Thereafter, a surface of the layer transferred wafer was mirror-polished with a removal amount of 3 μm, and the obtained wafer was reused for an SOI layer wafer. An SOI wafer was manufactured under the same conditions and procedure as those in the reference wafer by using this SOI layer wafer in which the layer transferred wafer was regenerated three times. This SOI wafer was determined as Example 1-3.

Example 1-4

A layer transferred wafer generated likewise according to Example 1-3 was accommodated in the heat treatment furnace with the same procedure as that of Example 1-1, heated from a room temperature to 1000° C. at a temperature elevating speed of 1000° C./minute, then held for 10 seconds, and subsequently subjected to rapid heating/rapid cooling, in which this wafer was cooled to the room temperature at a temperature lowering speed of 1000° C./minute. Thereafter, a surface of the layer transferred wafer is mirror-polished with a removal amount of 3 μm, and the obtained wafer was reused for an SOI layer wafer. An SOI wafer was manufactured under the same conditions and procedure as those in the reference wafer by using this SOI layer wafer in which the layer transferred wafer was regenerated four times. This SOI wafer was determined as Example 1-4.

Example 1-5

A layer transferred wafer generated likewise according to Example 1-4 was accommodated in the heat treatment furnace with the same procedure as that of Example 1-1, heated from a room temperature to 1000° C. at a temperature elevating speed of 1000° C./minute, then held for 10 seconds, and subsequently subjected to rapid heating/rapid cooling, in which this wafer was cooled to the room temperature at a temperature lowering speed of 1000° C./minute. Thereafter, a surface of the layer transferred wafer was mirror-polished with a removal amount of 3 μm, and the obtained wafer was reused for an SOI layer wafer. An SOI wafer was manufactured under the same conditions and procedure as those in the reference wafer by using this SOI layer wafer in which the layer transferred wafer was regenerated five times. This SOI wafer was determined as Example 1-5.

Comparative Example 1-1

A surface of a layer transferred wafer generated as a by-product through separation from an ion implanted area in manufacturing the reference wafer was mirror-polished with a removal amount of 3 μm, and this wafer was again reused for an SOI layer wafer. An SOI wafer was again manufactured under the same conditions and procedure as those in the reference wafer by using this SOI layer wafer in which the layer transferred wafer was regenerated once. This SOI wafer was determined as Comparative Example 1-1.

Comparative Example 1-2

A surface of a layer transferred wafer generated likewise according to Comparative Example 1-1 was mirror-polished with a removal amount of 3 μm, and this wafer was again reused for an SOI layer wafer. An SOI wafer was again manufactured under the same conditions and procedure as those in the reference wafer by using this SOI layer wafer in which the layer transferred wafer was regenerated twice. This SOI wafer was determined as Comparative Example 1-2.

Comparative Example 1-3

A surface of a layer transferred wafer generated likewise according to Comparative Example 1-2 was mirror-polished with a removal amount of 3 μm, and this wafer was again reused for an SOI layer wafer. An SOI wafer was again manufactured under the same conditions and procedure as those in the reference wafer by using this SOI layer wafer in which the layer transferred wafer was regenerated three times. This SOI wafer was determined as Comparative Example 1-3.

Comparative Example 1-4

A surface of a layer transferred wafer generated likewise according to Comparative Example 1-3 was mirror-polished with a removal amount of 3 μm, and this wafer was again reused for an SOI layer wafer. An SOI wafer was again manufactured under the same conditions and procedure as those in the reference wafer by using this SOI layer wafer in which the layer transferred wafer was regenerated four times. This SOI wafer was determined as Comparative Example 1-4.

Comparative Example 1-5

A surface of a layer transferred wafer generated likewise according to Comparative Example 1-4 was mirror-polished with a removal amount of 3 μm, and this wafer was again reused for an SOI layer wafer. An SOI wafer was again manufactured under the same conditions and procedure as those in the reference wafer by using this SOI layer wafer in which the layer transferred wafer was regenerated five times. This SOI wafer was determined as Comparative Example 1-5.

Other examples according to the present invention as well as comparative examples will now be described based on the second embodiment in detail.

Example 2-1

A surface of a layer transferred wafer generated through separation from an ion implanted area in manufacturing the reference wafer was mirror-polished with a removal amount of 3 μm, and this layer transferred wafer was accommodated in the heat treatment furnace, heated from a room temperature to 1000° C. at a temperature elevating speed of 1000° C./minute, then held for 10 seconds, and subsequently subjected to rapid heating/rapid cooling, in which this wafer was cooled to the room temperature at a temperature lowering speed of 1000° C./minute. Thereafter, the layer transferred wafer was dipped in a fluorinated acid solution having a concentration of 5% for 5 minutes. This layer transferred wafer was again reused for an SOI layer wafer. An SOI wafer was again manufactured under the same conditions and procedure as those in the reference wafer by using this SOI layer wafer in which the layer transferred wafer was regenerated once. This SOI wafer was determined as Example 2-1.

Example 2-2

A surface of a layer transferred wafer generated likewise according to Example 2-1 was mirror-polished with the same procedure as that in Example 2-1 with a removal amount of 3 μm, and this layer transferred wafer was accommodated in the heat treatment furnace, heated from a room temperature to 1000° C. at a temperature elevating speed of 1000° C./minute, then held for 10 seconds, and subsequently subjected to rapid heating/rapid cooling, in which this wafer was cooled to the room temperature at a temperature lowering speed of 1000° C./minute. Thereafter, the layer transferred wafer is immersed in a fluorinated acid solution having a concentration of 5% for 5 minutes. This layer transferred wafer was again reused for an SOI layer wafer. An SOI wafer was again manufactured under the same conditions and procedure as those in the reference wafer by using this SOI layer wafer in which the layer transferred wafer was regenerated twice. This SOI wafer was determined as Example 2-2.

Example 2-3

A surface of a layer transferred wafer generated likewise according to Example 2-2 was mirror-polished with the same procedure as that in Example 2-1 with a removal amount of 3 μm, and this layer transferred wafer was accommodated in the heat treatment furnace, heated from a room temperature to 1000° C. at a temperature elevating speed of 1000° C./minute, then held for 10 seconds, and subsequently subjected to rapid heating/rapid cooling, in which this wafer was cooled to the room temperature at a temperature lowering speed of 1000° C./minute. Thereafter, the layer transferred wafer was dipped in a fluorinated acid aqueous solution having a concentration of 5% for 5 minutes. This layer transferred wafer was again reused for an SOI layer wafer. An SOI wafer was again manufactured under the same conditions and procedure as those in the reference wafer by using this SOI layer wafer in which the layer transferred wafer was regenerated three times. This SOI wafer was determined as Example 2-3.

Example 2-4

A surface of a layer transferred wafer generated likewise according to Example 2-3 was mirror-polished with the same procedure as that in Example 2-1 with a removal amount of 3 μm, and this layer transferred wafer was accommodated in the heat treatment furnace, heated from a room temperature to 1000° C. at a temperature elevating speed of 1000° C./minute, then held for 10 seconds, and subsequently subjected to rapid heating/rapid cooling, in which this wafer was cooled to the room temperature at a temperature lowering speed of 1000° C./minute. Thereafter, the layer transferred wafer was dipped in a fluorinated acid aqueous solution having a concentration of 5% for 5 minutes. This layer transferred wafer was again reused for an SOI layer wafer. An SOI wafer was again manufactured under the same conditions and procedure as those in the reference wafer by using this SOI layer wafer in which the layer transferred wafer was regenerated four times. This SOI wafer was determined as Example 2-4.

Example 2-5

A surface of a layer transferred wafer likewise according to Example 2-4 was mirror-polished with the same procedure as that in Example 2-1 with a removal amount of 3 μm, and this layer transferred wafer was accommodated in the heat treatment furnace, heated from a room temperature to 1000° C. at a temperature elevating speed of 1000° C./minute, then held for 10 seconds, and subsequently subjected to rapid heating/rapid cooling, in which this wafer was cooled to the room temperature at a temperature lowering speed of 1000° C./minute. Thereafter, the layer transferred wafer was dipped in a fluorinated acid aqueous solution having a concentration of 5% for 5 minutes. This layer transferred wafer was again reused for an SOI layer wafer. An SOI wafer was again manufactured under the same conditions and procedure as those in the reference wafer by using this SOI layer wafer in which the layer transferred wafer was regenerated five times. This SOI wafer was determined as Example 2-5.

Comparative Example 2-1

A surface of a layer transferred wafer generated as a by-product through separation from an ion implanted area in manufacturing the reference wafer was mirror-polished with a removal amount of 3 μm, and this wafer was again reused for an SOI layer wafer. An SOI wafer was again manufactured under the same conditions and procedure as those in the reference wafer by using this SOI layer wafer in which the layer transferred wafer was regenerated once. This SOI wafer was determined as Comparative Example 2-1.

Comparative Example 2-2

A surface of a layer transferred wafer generated likewise according to Comparative Example 2-1 was mirror-polished with a removal amount of 3 μm, and this wafer was again reused for an SOI layer wafer. This layer transferred wafer was again reused for an SOI layer wafer. An SOI wafer was again manufactured under the same conditions and procedure as those in the reference wafer by using this SOI layer wafer in which the layer transferred wafer was regenerated twice. This SOI wafer was determined as Comparative Example 2-2.

Comparative Example 2-3

A surface of a layer transferred wafer generated likewise according to Comparative Example 2-2 was mirror-polished with a removal amount of 3 μm, and this wafer was again reused for an SOI layer wafer. An SOI wafer was again manufactured under the same conditions and procedure as those in the reference wafer by using this SOI layer wafer in which the layer transferred wafer was regenerated three times. This SOI wafer was determined as Comparative Example 2-3.

Comparative Example 2-4

A surface of a layer transferred wafer generated likewise according to Comparative Example 2-3 was mirror-polished with a removal amount of 3 µm, and this wafer was again reused for an SOI layer wafer. An SOI wafer was again manufactured under the same conditions and procedure as those in the reference wafer by using this SOI layer wafer in which the layer transferred wafer was regenerated four times. This SOI wafer was determined as Comparative Example 2-4.

Comparative Example 2-5

A surface of a layer transferred wafer generated likewise according to Comparative Example 2-4 was mirror-polished with a removal amount of 3 µm, and this wafer was again reused for an SOI layer wafer. An SOI wafer was again manufactured under the same conditions and procedure as those in the reference wafer by using this SOI layer wafer in which the layer transferred wafer was regenerated five times. This SOI wafer was determined as Comparative Example 2-5.

Comparative Test and Evaluation

Figure 3:
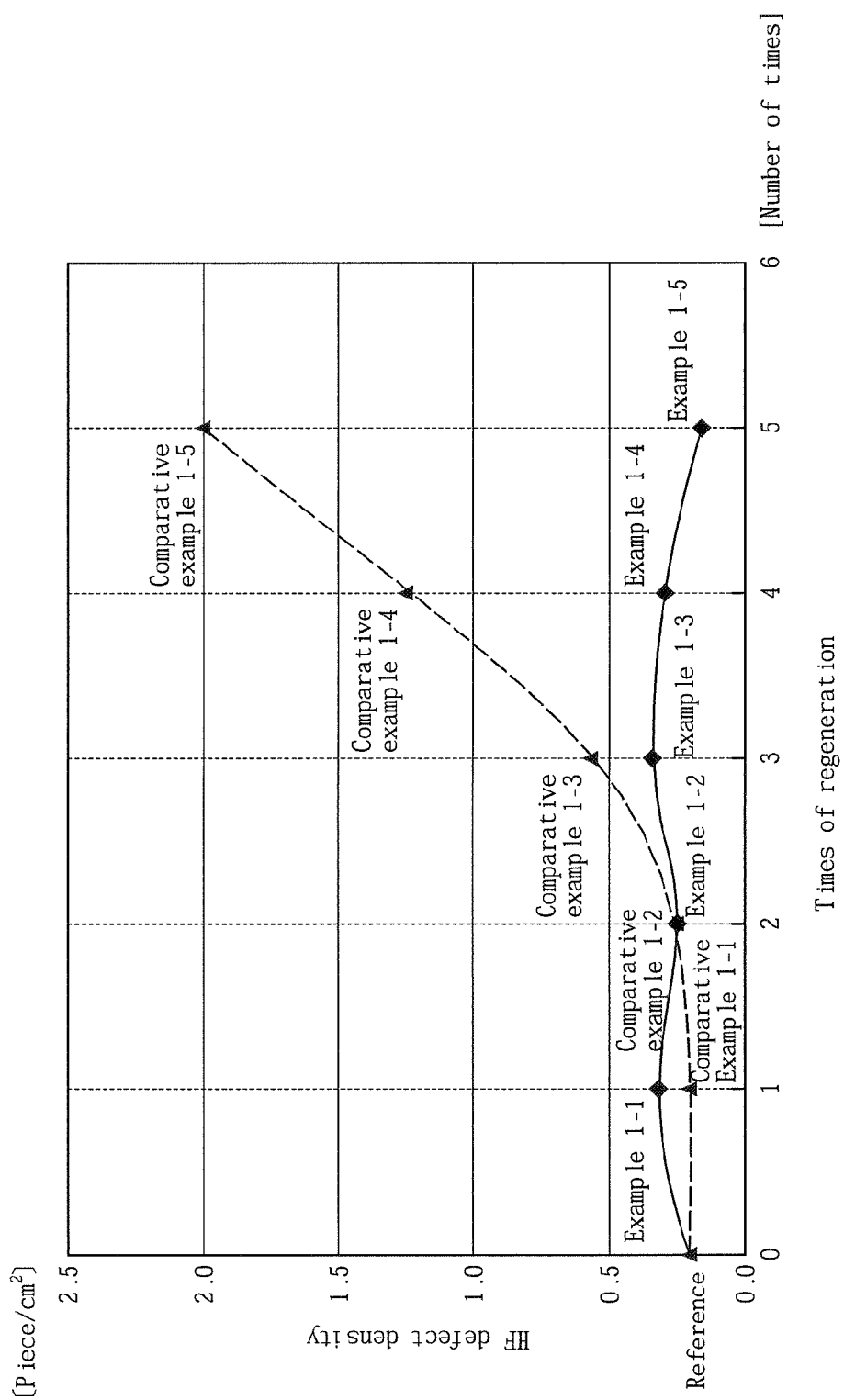
FIG. 3 is a diagram showing a correlation between the times of regeneration and an HF defect density in layer transferred wafers according to a reference, Example 1-1 to 1-5 and Comparative Example 1-1 to 1-5 according to the first example of the present invention.
Figure 4:
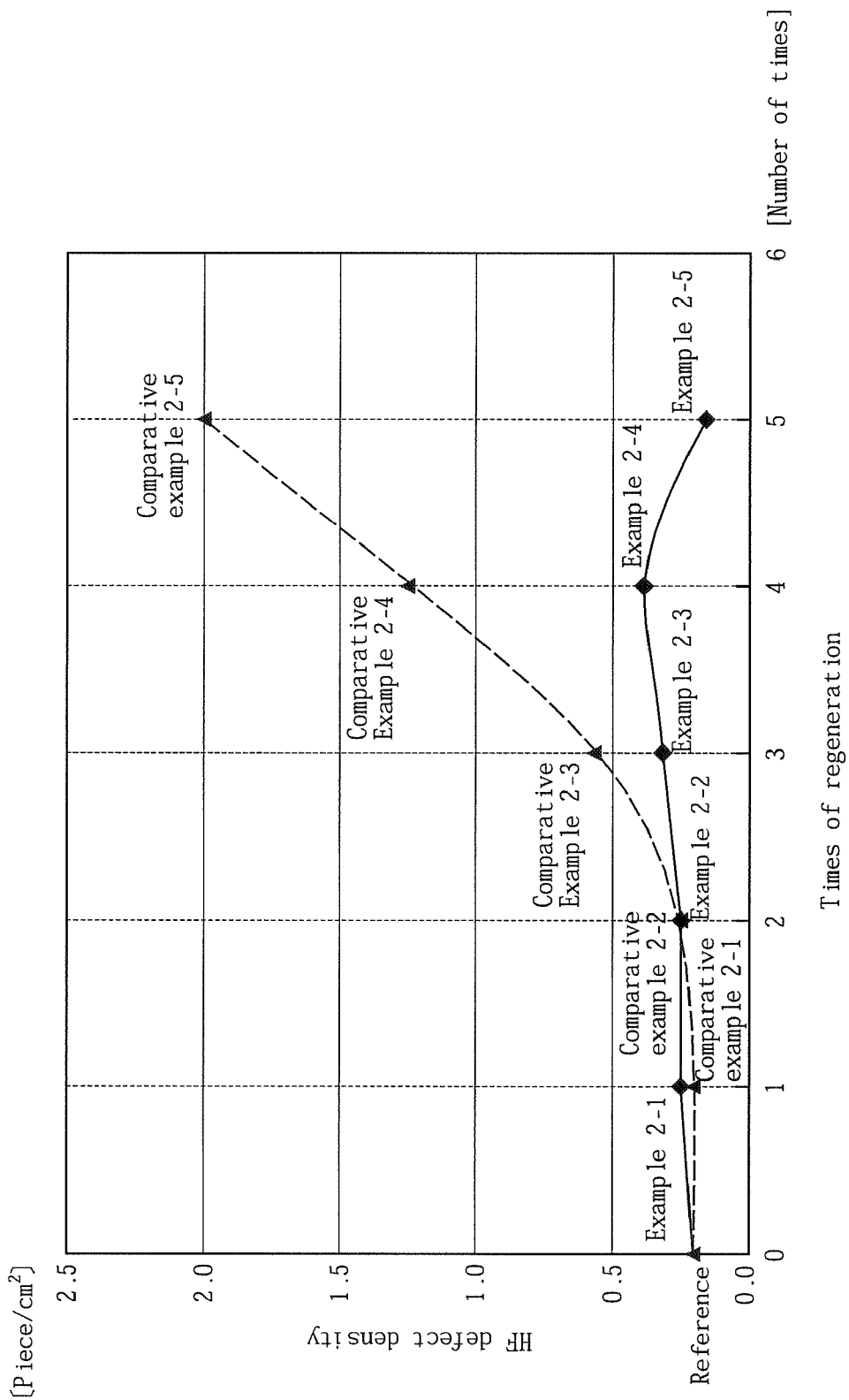
FIG. 4 is a diagram showing a relationship between the times of regeneration and an HF defect density in layer transferred wafers according to a reference, Example 2-1 to 2-5 and Comparative Examples 2-1 to 2-5 according to the second example of the present invention.
Figure 5:
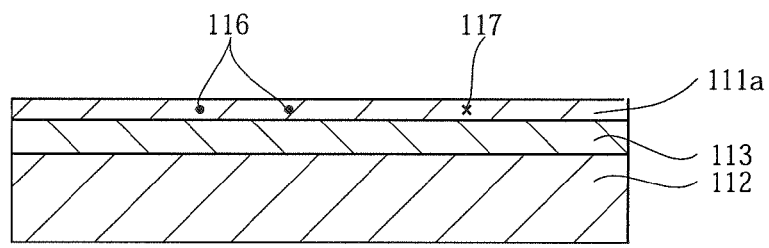
FIG. 5 is cross-sectional views showing HF defects.
Figure 5:
Figure 5:
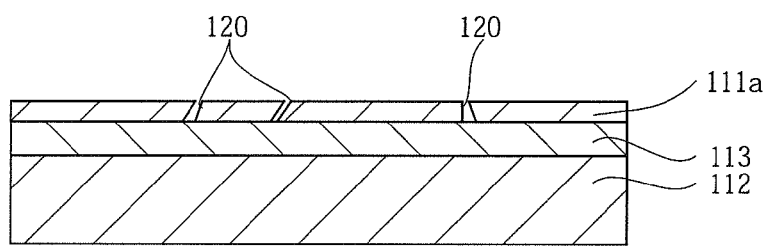
Figure 5:
Figure 5:
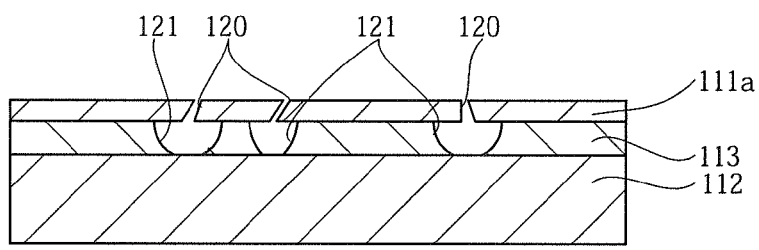

The SOI wafer according to each of the reference, Examples 1-1 to 2-5 and Comparative Examples 1-1 to 2-5 was dipped in a hydrofluoric acid aqueous solution having a concentration of 50% for 30 minutes, and then observed by using an optical microscope of a 50-fold magnifying power to count the number of HF defects on the surface of the SOI wafer. This number was divided by a wafer area to calculate an HF defect density. FIG. 3 shows a result in the first embodiment and FIG. 4 shows a result in the second embodiment.

As apparent from FIG. 3, a distinguished difference in an HF defect density did not appear in the reference, Examples 1-1 and 1-2 and Comparative Example 1-1 and 1-2 in which the times of regeneration were 0 to 2. However, a defect density was $0.2/cm^2$ in Example 1-5, whereas an HF defect density in Comparative Example 1-5 in which rapid heating/rapid cooling according to the present invention was not performed to the layer transferred wafer was approximately tenfold, i.e., $2.0/cm^2$. Further, a distinguished difference did not appear in each HF defect density when the times of regeneration were 0 to 2 in FIG. 3 as well as FIG. 4. However, an HF defect density in Example 2-3 where the times of regeneration were three was $0.3/cm^2$, whereas an HF defect density in Comparative Example 2-3 was approximately doubled, i.e., $0.6/cm^2$. Further, an HF defect density in Example 2-4 where the times of regeneration were four was $0.4/cm^2$, whereas an HF defect density became approximately threefold, i.e., $1.3/cm^2$ in Comparative Example 2-4. It was found from this result that the more times the regeneration was performed, the more the generation of HF defects could be inhibited by performing the regeneration of the layer transferred wafer including the rapid heating/rapid cooling according to the present invention.

What is claimed is:

1. A process for regenerating a layer transferred wafer, obtained as a by-product in manufacturing a bonded SOI wafer by an ion implantation separation method so as to be reused for an SOI layer wafer of the bonded SOI wafer, comprising:

rapidly heating the layer transferred wafer in an oxidizing atmosphere, then holding it for a fixed time and rapidly cooling it; followed by mirror-polishing a surface of the cooled layer transferred wafer, wherein through rapid heating/rapid cooling the layer transferred wafer is heated from a room temperature to a temperature in the range of 1000 to 1350° C. at a temperature elevating rate of 50 to 5000° C./minute, then the wafer is held at the raised temperature for 1 to 1000 seconds, whereby oxygen precipitate nuclei or oxygen precipitates are dissolved, and subsequently the wafer is cooled from the raised temperature to a room temperature at a temperature rate of 50 to 5000° C./minute, whereby a solid solution is maintained and oxygen precipitate nuclei or oxygen precipitates are eliminated.

2. The process according to claim 1, wherein the oxidizing atmosphere is an oxygen gas, a nitrogen gas containing oxygen or an argon gas containing oxygen.

3. The process according to claim 1, wherein the amount removed in mirror-polishing is 1 to 5 µm.

4. The process according to claim 1, wherein an oxide film on a chamfered portion and an ion implanted area in the chamfered portion of the layer transferred wafer are removed by edge polishing after the rapid heating and rapidly cooling steps and before mirror-polishing.

5. A process for regenerating a layer transferred wafer, in which a layer transferred wafer obtained as a by-product in manufacturing a bonded SOI wafer by an ion implantation separation method so as to be reused for an SOI layer wafer of the bonded SOI wafer, comprising:

mirror-polishing a surface of the layer transferred wafer;

rapidly heating the layer transferred wafer in an oxidizing atmosphere, then holding it for a fixed time and subsequently rapidly cooling it; and removing an oxide film on the surface of the cooled layer transferred wafer, wherein through rapidly heating/rapidly cooling the layer transferred wafer is heated from a room temperature to a temperature in the range of 1000 to 1350° C. at a temperature elevating rate of 50 to 5000° C./minute, then the wafer is held at the raised temperature for 1 to 1000 seconds, whereby oxygen precipitate nuclei or oxygen precipitates are dissolved, and subsequently the wafer is cooled from the raised temperature to a room temperature at a temperature rate of 50 to 5000° C./minute, whereby a solid solution is maintained and oxygen precipitate nuclei or oxygen precipitates are eliminated.

6. The process according to claim 5, wherein the oxidizing atmosphere is an oxygen gas, a nitrogen gas containing oxygen or an argon gas containing oxygen.

7. The process according to claim 5, wherein the amount removed in mirror-polishing is 1 to 5 µm.

8. The process according to claim 5, wherein the oxide film on a chamfered portion and an ion implanted area in the chamfered portion of the layer transferred wafer are removed by edge polishing before mirror-polishing.

9. The process according to claim 5, wherein a removal amount of the oxide film is performed by using an aqueous solution containing fluorinated acid.

10. The process according to claim 1, wherein the temperature elevating rate is 1000 to 5000° C./minute and the wafer is cooled from the raised temperature to room temperature at a temperature speed of 1000 to 5000° C./minute.

11. The process according to claim 1, wherein the temperature elevating rate is 1000 to 3000° C./minute and the wafer is cooled from the raised temperature to room temperature at a temperature speed of 1000 to 3000° C./minute.

12. The process according to claim 1, wherein the layer transferred wafer is heated from room temperature to a temperature in the range of 1050 to 1200° C.

13. The process according to claim 5, wherein the temperature elevating rate is 1000 to 5000° C./minute and the wafer is cooled from the raised temperature to room temperature at a temperature speed of 1000 to 5000° C./minute.

14. The process according to claim 5, wherein the temperature elevating rate is 1000 to 3000° C./minute and the wafer is cooled from the raised temperature to room temperature at a temperature speed of 1000 to 3000° C./minute.

15. The process according to claim 5, wherein the layer transferred wafer is heated from room temperature to a temperature in the range of 1050 to 1200° C.

* * * * *